United States Patent [19]
Fujii et al.

[11] Patent Number: 5,170,231
[45] Date of Patent: Dec. 8, 1992

[54] SILICON CARBIDE FIELD-EFFECT TRANSISTOR WITH IMPROVED BREAKDOWN VOLTAGE AND LOW LEAKAGE CURRENT

[75] Inventors: Yoshihisa Fujii; Akira Suzuki, both of Nara; Katsuki Furukawa, Sakai, all of Japan

[73] Assignee: Sharp Kabushiki Kaisha, Osaka, Japan

[21] Appl. No.: 705,630

[22] Filed: May 24, 1991

[30] Foreign Application Priority Data

May 24, 1990 [JP] Japan ................. 2-134780

[51] Int. Cl.⁵ .................................. H01L 29/78
[52] U.S. Cl. ............................. 357/23.2; 357/23.1;
357/23.8; 357/61; 437/100
[58] Field of Search ............. 357/23.1, 23.2, 23.8, 357/61; 437/100

[56] References Cited

U.S. PATENT DOCUMENTS

| | | | |
|---|---|---|---|
| 4,757,028 | 7/1988 | Kondoh et al. | 437/100 |
| 4,762,806 | 8/1988 | Suzuki et al. | 437/100 |
| 4,897,710 | 1/1990 | Suzuki et al. | 357/61 |
| 4,945,394 | 7/1990 | Palmour et al. | 357/61 |
| 4,947,218 | 8/1990 | Edmond et al. | 357/61 |
| 4,980,303 | 12/1990 | Yamauchi | 437/100 |
| 4,994,413 | 2/1991 | Eshita | 437/100 |

FOREIGN PATENT DOCUMENTS

| | | | |
|---|---|---|---|
| 59-203799 | 11/1984 | Japan | 357/23.2 |
| 63-303900 | 12/1988 | Japan | 437/100 |
| 1-175767 | 7/1989 | Japan | 357/61 |
| 1-194315 | 8/1989 | Japan | 437/100 |
| 1-196873 | 8/1989 | Japan | 357/61 |

OTHER PUBLICATIONS

U.S. Patent Application Ser. No. 07/534,046 filed Jun. 6, 1990, Fujii et al.
J. W. Palmour et al., J. Appl. Phys. 64(4), Published on Aug. 15, 1988, pp. 2168–2177.
Yu. M. Tairov et al., Journal of Crystal Growth 52 (1981), pp. 246–150.

*Primary Examiner*—Rolf Hille
*Assistant Examiner*—Steven Loke
*Attorney, Agent, or Firm*—Morrison & Foerster

[57] ABSTRACT

A silicon carbide field-effect transistor is provided which includes a semiconductor substrate, a channel formation layer of silicon carbide formed above the substrate, source and drain regions provided in contact with the channel formation layer, a gate insulator disposed between the source and drain regions, and a gate electrode formed on the gate insulator, wherein a first contact between the channel formation layer and the drain region exhibits different electric characteristics from those of a second contact between the channel formation layer and the source region. Also provided is a method for producing such a silicon carbide field-effect transistor.

6 Claims, 4 Drawing Sheets

SILICON CARBIDE FIELD-EFFECT TRANSISTOR WITH IMPROVED BREAKDOWN VOLTAGE AND LOW LEAKAGE CURRENT

BACKGROUND OF THE INVENTION

1. Field of the Invention

This invention relates to a field-effect transistor having a channel formation layer of silicon carbide disposed in contact with source and drain regions, and more particularly, it relates to a silicon carbide field-effect transistor in which the contact formed between the channel formation layer and the source region exhibits different electric characteristics from those of the contact formed between the channel formation layer and the drain region. This invention also relates to a method for the production of such a silicon carbide field-effect transistor.

2. Description of the Prior Art

Silicon carbide (SiC) is a semiconductor material with a wide band gap of 2.2 to 3.3 electron-volts (eV), which is thermally, chemically and mechanically quite stable, and also has a great resistance to radiation damage. Furthermore, the saturation drift velocity of electrons in silicon carbide is greater than that in silicon (Si) and other semiconductor materials. The use of semiconductor devices made of conventional semiconductor materials such as silicon is difficult under severe conditions of high temperature, high output drive, high frequency operation, and radiation exposure. Therefore, semiconductor devices using silicon carbide are expected to have wide applications for devices which are used under such conditions.

For the purpose of fabricating such a silicon carbide semiconductor device, there has been developed a process for growing a large-sized high-quality SiC single crystal on an inexpensive and commercially available Si single-crystal substrate by chemical vapor deposition (Japanese Laid-Open Patent Publication No. 59-203799). Other conventional processes include growing a pure and high-quality SiC bulk single crystal by sublimation (Yu. M. Tairov and V. F. Tsvetkov, J. Crystal Growth 52(1981), p. 146); and growing an SiC single-crystal layer by chemical vapor deposition on an SiC bulk single-crystal substrate obtained by sublimation.

The above-mentioned conventional methods make it possible to control the conductivity type, the impurity concentration, or the like of silicon carbide single crystals by adding appropriate impurities during the growth of the single crystals. Therefore, SiC single crystals prepared by these methods have been widely used for the development of various semiconductor devices. Examples of the silicon carbide semiconductor devices include an inversion-mode metal-oxide-semiconductor field-effect transistor (MOSFET) fabricated on a silicon carbide layer which functions as a channel formation layer (see, for example, U.S. patent application Ser. No. 07/534,046, filed on Jun. 6, 1990; and J. W. Palmour, H. S. Kong, and R. F. Davis, J. Appl. Phys. 64, 2168 (1988)). As used herein, the term channel formation layer refers to a semiconductor layer in which a channel region will be formed in the on state of the transistor.

For the purpose of producing an inversion-mode MOSFET, a channel formation layer should be formed in a semiconductor substrate or semiconductor layer grown thereon. The channel formation layer should also be provided with source and drain regions of the opposite conductivity type thereto. In other words, when an inversion-mode n-channel MOSFET is fabricated with the use of a p-type channel formation layer, the source and drain regions of the n-type must be formed in the p-type channel formation layer. When an inversion-mode p-channel MOSFET is fabricated with the use of an n-type channel formation layer, the source and drain regions of the p-type must be formed in the n-type channel formation layer.

In a field-effect transistor such as described above, the electric characteristics of the contacts formed between the channel formation layer and the source region and between the channel formation layer and the drain region greatly affect the device characteristics of the transistor itself.

In general, a field-effect transistor can be put into practical use in the following conditions of: (1) high breakdown voltage between the source and drain regions; (2) sufficiently reduced leakage current to the substrate when applying a drain voltage; and (3) sufficiently reduced on-state resistance of the transistor.

At present, for the production of silicon carbide field-effect transistors which have been recently developed, source and drain regions are simultaneously formed in a channel formation layer by ion implantation. Thus, the p-n junction formed between the channel formation layer and the source region exhibits the same characteristics as those of the p-n junction formed between the channel formation layer and the drain region. Such a field-effect transistor does not attain excellent device characteristics because it does not satisfy the above-mentioned conditions. In order to satisfy those conditions, the electric characteristics of the p-n junction between the channel formation layer and the source region should be different from those of the p-n junction between the channel formation layer and the drain region, as will be described below.

Among the above-mentioned conditions, the conditions (1) and (2) depend on the electric characteristics (particularly, in the reverse direction) of the p-n junction formed between the channel formation layer and the drain region, while the condition (3) depends on the electric characteristics (particularly, in the forward direction) of the p-n junction formed between the channel formation layer and the source region, and it also depends on the resistance of the source region.

The development of a field-effect transistor having source and drain regions which can attain the above-mentioned respective electric characteristics has not yet been successful. Thus, a silicon carbide field-effect transistor with excellent device characteristics has not yet been put into practical use.

SUMMARY OF THE INVENTION

The silicon carbide field-effect transistor of this invention, which overcomes the above-discussed and numerous other disadvantages and deficiencies of the prior art, comprises a semiconductor substrate, a channel formation layer of silicon carbide formed above the substrate, source and drain regions provided in contact with the channel formation layer, a gate insulator disposed between the source and drain regions, and a gate electrode formed on the gate insulator, wherein a first contact between the channel formation layer and the drain region exhibits different electric characteristics from those of a second contact between the channel formation layer and the source region.

In a preferred embodiment, the source and drain regions are provided in the channel formation layer, and the gate insulator is formed on the channel formation layer.

In a preferred embodiment, the channel formation layer is formed on the drain region, and the source region is formed on the channel formation layer.

In a preferred embodiment, the channel formation layer is formed on the drain region, and the source region is provided in the channel formation layer.

In a preferred embodiment, the first contact is a p-n junction having excellent electric characteristics in the reverse direction thereof, and the second contact is a p-n junction having excellent electric characteristics in the forward direction thereof.

In a preferred embodiment, the first contact is a p-n junction having excellent electric characteristics in the reverse direction thereof, and the second contact is a Schottky junction having excellent electric characteristics in the forward direction thereof.

A method of this invention for producing a silicon carbide field-effect transistor, comprises the steps of: growing a silicon carbide single-crystal layer of a first conductivity type as a channel formation layer above a semiconductor substrate; forming a thermal oxide film as a gate insulator on the silicon carbide single-crystal layer; growing a polycrystalline silicon film as a gate electrode on the thermal oxide film; introducing impurities of a second conductivity type into a portion of the silicon carbide single-crystal layer to form a drain region having a first contact with the channel formation layer, the first contact exhibiting excellent electric characteristics in the reverse direction thereof; and introducing impurities of a second conductivity type into a portion of the silicon carbide single-crystal layer to form a source region having a second contact with the channel formation layer, the second contact exhibiting excellent electric characteristics in the forward direction thereof.

In a preferred embodiment, the first and second contacts are p-n junctions formed by ion implantation and subsequent heat treatment, and the duration of the heat treatment for the first contact is longer than that of the heat treatment for the second contact.

Another method of this invention for producing a silicon carbide field-effect transistor, comprises the steps of: growing a first silicon carbide single-crystal layer of a first conductivity type as a drain layer above a semiconductor substrate; growing a second silicon carbide single-crystal layer of a second conductivity type as a channel formation layer on the first silicon carbide single-crystal layer, the channel formation layer having a first contact with the drain layer, and the first contact exhibiting excellent electric characteristics in the reverse direction thereof; forming a concave portion in the first silicon carbide single-crystal layer down to the second silicon carbide single-crystal layer; forming a thermal oxide film as a gate insulator on the internal surface of the concave portion of the first and second silicon carbide single-crystal layers; growing a polycrystalline silicon film as a gate electrode on the thermal oxide film; and forming a source layer on the second silicon carbide single-crystal layer, the source layer having a second contact with the channel formation layer, and the second contact exhibiting excellent electric characteristics in the forward direction thereof.

In a preferred embodiment, the first contact is a p-n junction formed by chemical vapor deposition, and the second contact is a Schottky junction formed by vacuum deposition.

Still another method of this invention for producing a silicon carbide field-effect transistor, comprises the steps of: growing a first silicon carbide single-crystal layer of a first conductivity type as a drain layer above a semiconductor substrate; growing a second silicon carbide single-crystal layer of a second conductivity type as a channel formation layer on the first silicon carbide single-crystal layer, the channel formation layer having a first contact with the drain layer, and the first contact exhibiting excellent electric characteristics in the reverse direction thereof; forming a source region in the second silicon carbide single-crystal layer, the source layer having a second contact with the channel formation layer, and the second contact exhibiting excellent electric characteristics in the forward direction thereof; forming a concave portion in the first silicon carbide single-crystal layer through the source region down to the second silicon carbide single-crystal layer; forming a thermal oxide film as a gate insulator on the internal surface of the concave portion of the first and second silicon carbide single-crystal layers; and growing a polycrystalline silicon film as a gate electrode on the thermal oxide film.

In a preferred embodiment, the first contact is a p-n junction formed by chemical vapor deposition, and the second contact is a p-n junction formed by ion implantation and subsequent heat treatment.

Thus, the invention described herein makes possible the objectives of (1) providing a silicon carbide field-effect transistor in which the source and drain regions have their most suitable contacts with the channel formation layer, so that breakdown voltage between the source and drain regions can be improved and that the leakage current and on-state resistance can be significantly reduced, resulting in quite excellent device characteristics; (2) providing a silicon carbide field-effect transistor which can be used under severe conditions of high temperature, high output drive, high frequency operation, and radiation exposure, where difficulties are encountered with devices made of conventional semiconductor materials such as silicon; and (3) providing a method for producing a silicon carbide field-effect transistor with such excellent device characteristics.

BRIEF DESCRIPTION OF THE DRAWINGS

This invention may be better understood and its numerous objects and advantages will become apparent to those skilled in the art by reference to the accompanying drawings as follows.

DETAILED DESCRIPTION OF THE INVENTION

Figure 1A:
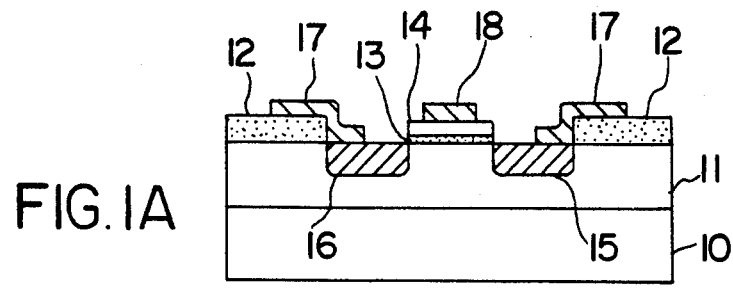
FIG. 1A is a sectional view showing an inversion-mode n-channel MOSFET of this invention.

The field-effect transistor of this invention comprises a channel formation layer of silicon carbide disposed in contact with source and drain regions. The first contact between the channel formation layer and the drain region exhibits different characteristics from those of the second contact between the channel formation layer and the source region.

The method for producing such a field-effect transistor according to this invention comprises the separate steps of: forming a first contact between the channel formation layer and the drain region; and forming a second contact between the channel formation layer and the source region. The structures of the source and drain regions and the processes for forming these regions are selected in such a manner that the first and second contacts exhibit different electric characteristics from each other.

In general, the electric characteristics of the contacts between the channel formation layer and the source region and between the channel formation layer and the drain region depend on the structures of the source and drain regions and/or on the processes for forming these regions. Thus, an appropriate selection of the structures and processes makes it possible to obtain most suitable contacts for desired electric characteristics.

For example, when source and drain regions are to be formed by ion implantation, the contacts (in this case, p-n junctions) between the channel formation layer and the source region and between the channel formation layer and the drain region are allowed to have desired electric characteristics by controlling the conditions (e.g., duration) of heat treatment which is performed after the ion implantation.

In ion implantation, since impurities are introduced into a semiconductor layer after the growth thereof, the amount of impurities to be introduced and the distribution of impurities introduced can readily be reproduced with high accuracy. Thus, the ion implantation makes it easier to obtain n-type and p-type semiconductor layers of low resistivity, as compared with chemical vapor deposition in which impurities are introduced during the growth of a semiconductor layer. The ion implantation also makes it possible to form p-n junctions having excellent electric characteristics in the forward direction thereof because the interfaces at these junctions have excellent properties. For that purpose, for example, heat treatment after the ion implantation is usually conducted at a temperature of 1000° C. to 1300° C. for 5 to 60 min, preferably for 20 to 40 min.

In cases where the duration of heat treatment after the ion implantation is short, there may remain defects caused by injection damage in the vicinity of the junction interfaces. The resulting p-n junctions have inferior electric characteristics in the reverse direction thereof to those of p-n junctions formed by chemical vapor deposition. Thus, when a p-n junction is formed between the channel formation layer and the source region by ion implantation and subsequent heat treatment for a short period of time, the on-state resistance of the resultant field-effect transistor can be reduced.

The defects caused by injection damage may be eliminated by heat treatment for a long period of time, and the electric characteristics in the reverse direction of the resulting p-n junctions becomes excellent, as compared with the p-n junction formed by ion implantation and subsequent heat treatment for a short period of time. Thus, when a p-n junction is formed between the channel formation layer and the drain region by ion implantation and subsequent heat treatment for a long period of time, the breakdown voltage between the source and drain regions of the resultant field-effect transistor can be improved, and the leakage current to the substrate when applying a drain voltage can be significantly reduced. For that purpose, for example, heat treatment after the ion implantation is usually conducted at a temperature of 1100° C. to 1400° C. for 1 to 8 hours, preferably for 3 to 7 hours.

For the reduction in the on-state resistance of a field-effect transistor, it is possible to use not only p-n junctions but also Schottky junctions (or Schottky contacts) which exhibit rectifying characteristics. A Schottky junction can readily be formed by depositing a thin metal film on an SiC single-crystal layer or subsequently reacting the thin metal film with the SiC single-crystal layer to form a thin film made of a compound of this metal. Unlike the case of ion implantation, the SiC single-crystal layer will not change its properties when the Schottky junction is being formed thereon, so that the Schottky junction obtained can exhibit better rectifying characteristics than those of the p-n junction formed by ion implantation. Moreover, metal materials used for forming a Schottky junction usually have an extremely small resistivity as compared to semiconductors, and also have a sufficiently small contact resistance to other metals used as a wiring material. Therefore, with the use of a Schottky junction, the on-state resistance of field-effect transistors can be satisfactorily reduced.

The metals and compounds thereof which are used for forming a Schottky junction may be any of those which can provide a Schottky junction together with silicon carbide. Specific examples thereof include metals, such as aluminum (Al), platinum (Pt), and gold (Au), and various compounds of these metals (e.g., compounds containing silicon and/or carbon together with at least one of these metals).

On the contrary, p-n junctions obtained by chemical vapor deposition exhibit excellent electric characteristics in the reverse direction thereof, as compared with p-n junctions formed by ion implantation or Schottky junctions. Thus, when chemical vapor deposition is used to form a p-n junction between the channel formation layer and the drain region, the breakdown voltage between the source and drain regions can be increased and the leakage current can be significantly reduced.

Therefore, a combination of the p-n junction formed by chemical vapor deposition and the p-n junction formed by ion implantation, or a combination of the p-n junction formed by chemical vapor deposition and the Schottky junction can provide most suitable electric characteristics for the contact between the channel formation layer and the drain region and for the contact between the channel formation layer and the source region, respectively.

DESCRIPTION OF THE PREFERRED EMBODIMENTS

The invention will be further illustrated by reference to the following examples.

EXAMPLE 1

In this example, an inversion-mode n-channel MOSFET was produced using an SiC single crystal grown on an Si single-crystal substrate. The MOSFET of this example has source and drain regions formed by ion implantation, and there are p-n junctions provided between the channel formation layer and the source and drain regions. These p-n junctions are allowed to have different excellent electric characteristics from each other by controlling the duration of heat treatment performed after ion implantation.

FIG. 1A shows an inversion-mode n-channel MOSFET of this example, which was produced as follows.

Figure 1B:
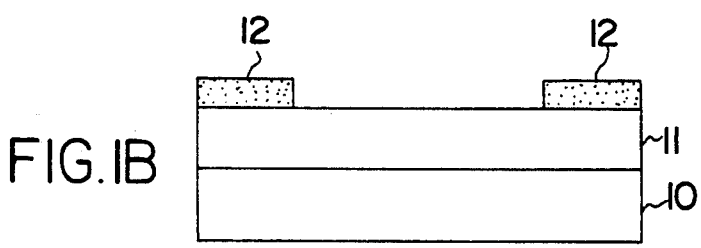
FIGS. 1B–1F are sectional views showing the production of the MOSFET of FIG. 1A.

First, as shown in FIG. 1B, on an Si single-crystal substrate 10, an Al-doped $\beta$-type p-SiC single-crystal layer 11 (with a thickness of about 10 $\mu$m and a carrier concentration of $5 \times 10^{16}$ cm$^{-3}$) was grown by chemical vapor deposition. The p-SiC single-crystal layer 11 was used as a channel formation layer in which a channel region would be formed in the on state of the transistor. As the source gases for chemical vapor deposition, silane (SiH$_4$) and propane (C$_3$H$_8$) were used. As the impurity gas for doping, trimethyl aluminum ((CH$_3$)$_3$Al) was used.

Then, on the p-SiC single-crystal layer 11, an SiO$_2$ film was formed by chemical vapor deposition. For the growth of the SiO$_2$ film, plasma chemical vapor deposition may also be used. Thereafter, with the use of photolithography, the portion of the SiO$_2$ film corresponding to a device formation region was removed by an etching technique, resulting in a field insulating film 12, as shown in FIG. 1B. As an etchant for the etching of the SiO$_2$ film, a solution of hydrogen fluoride (HF) was used.

Figure 1C:
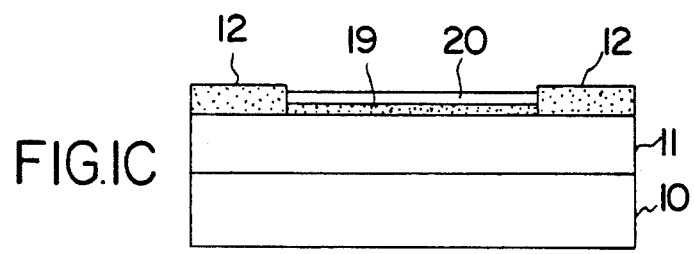

On the exposed surface of the p-SiC single-crystal layer 11, a thermal oxide film 19 (with a thickness of about 50 nm) was then formed by thermal oxidation in an atmosphere of oxygen at about 1100° C. for 3 hours. Then, as shown in FIG. 1C, on the thermal oxide film 19, a P-doped Si polycrystalline film 20 (with a thickness of about 500 nm) was formed by chemical vapor deposition.

Figure 1D:
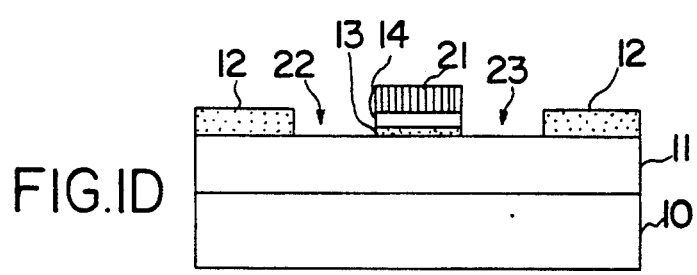

Next, a resist pattern 21 (with a width of 5 $\mu$m) for gate formation was formed with the use of photolithography, after which the portions of the thermal oxide film 19 and Si polycrystalline film 20 corresponding to source and drain regions to be formed later were removed by an etching technique. As a result, openings 22 and 23 were provided and a gate insulator film 13 and a gate electrode 14 were formed therebetween, as shown in FIG. 1D.

Figure 1E:
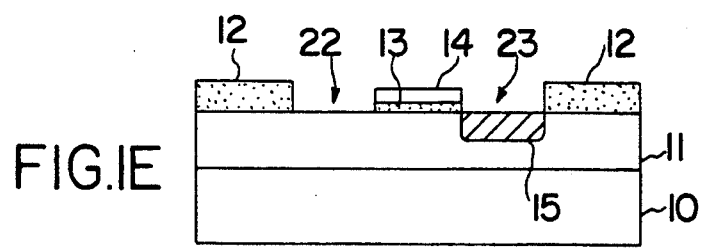

The resist pattern 21 was then removed. Using photolithography, the exposed surface of the p-SiC single-crystal layer 11 in the opening 22 alone was covered with a resist film. This resist film, the field insulating film 12, the gate insulating film 13, and the gate electrode 14 were used as a mask to inject phosphorus (P+) ions into a surface portion of the p-SiC single-crystal layer 11 corresponding to the opening 23. The injection energy was 100 KeV, and the amount of the injected ions was $3 \times 10^{14}$ cm$^{-2}$. Then, the resist film was removed from the opening 22, after which heat treatment was conducted in an atmosphere of nitrogen at 1100° C. for 5 hours, resulting in a drain region 15 as shown in FIG. 1E. In this way, a p-n junction was obtained between the p-SiC single-crystal layer 11 (i.e., channel formation layer) and the drain region 15.

Figure 1F:
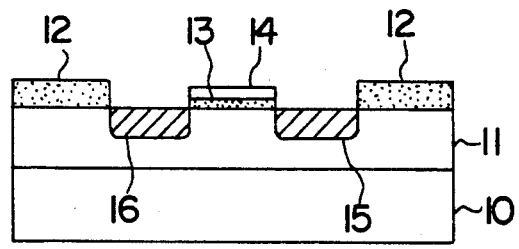

Similarly, after the exposed surface of the p-SiC single-crystal layer 11 in the opening 23 was covered with a resist film, phosphorus (P+) ions were injected into a portion of the p-SiC single-crystal layer 11 corresponding to the opening 22. The conditions used for the ion implantation were the same as those described above. Thereafter, heat treatment was conducted in an atmosphere of nitrogen at 1100° C. for 30 minutes, resulting in a source region 16 as shown in FIG. 1F. In this way, a p-n junction was also obtained between the p-SiC single-crystal layer 11 (i.e., channel formation layer) and the source region 16.

Finally, wiring electrodes 17 and 18 were formed by vacuum deposition of aluminum and subsequent patterning, resulting in an inversion-mode n-channel MOSFET as shown in FIG. 1A.

Figure 2:
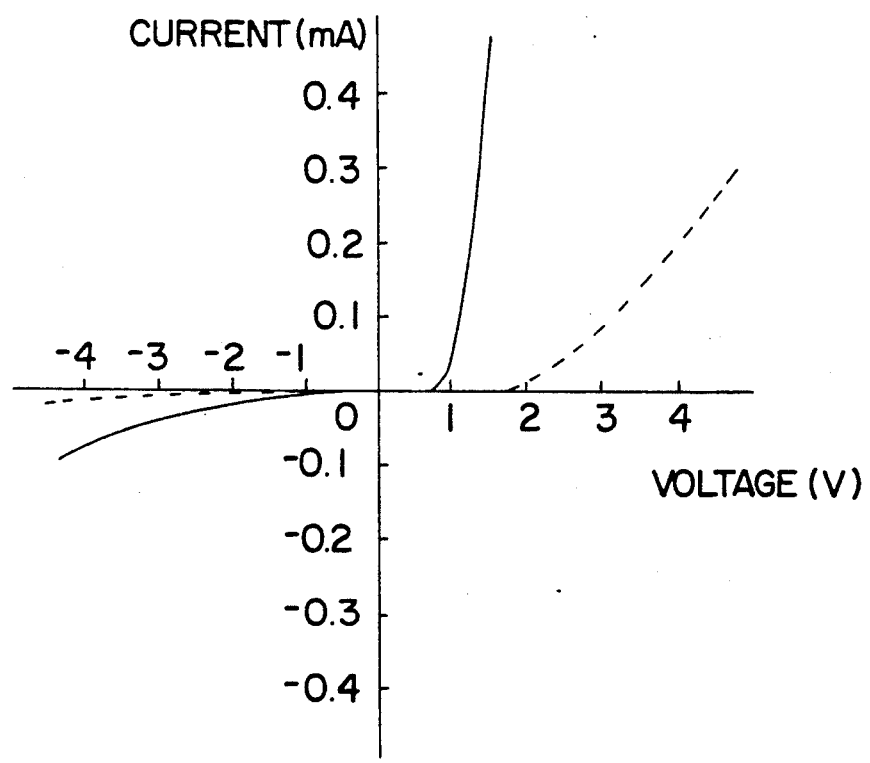
FIG. 2 is a graph showing the current-voltage characteristics of the p-n junction between the channel formation layer and the source region (by the solid line) and of the p-n junction between the channel formation layer and the drain region (by the broken line) for the MOSFET of FIG. 1A.

FIG. 2 shows the electric characteristics of p-n junctions between the p-SiC single-crystal layer 11 and the P+ ion-injected regions 15 and 16. The electric characteristics of the p-n junction between the p-SiC single-crystal layer 11 and the source region 16 are indicated by the solid line, while those of the p-n junction between the p-SiC single-crystal layer 11 and the drain region 15 are indicated by the broken line. As can be seen from the figure, even though the conditions for the ion implantation are the same, the difference in the conditions for the heat treatment performed after the implantation (in this example, difference in the duration of the heat treatment) causes a great difference in electric characteristics of the resultant p-n junctions. When the duration of the heat treatment is short (e.g., for 30 minutes as in the formation of the source region 16), the electric characteristics in the reverse direction of the resultant p-n junction are poor (i.e., the leakage current level is high), but the electric characteristics in the forward direction thereof are excellent (i.e., the series resistance and the threshold voltage are low). When the duration of the heat treatment is long (e.g., for 5 hours as in the formation of the drain region 15), the electric characteristics in the forward direction of the resultant p-n junction are poor (i.e., the series resistance and the threshold voltage are high), but the electric characteristics in the reverse direction thereof are excellent (i.e., the leakage current level is low).

Therefore, in the MOSFET of this example, the p-n junction between the channel formation layer and the source region exhibits excellent electric characteristics in the forward direction thereof, while the p-n junction between the channel formation layer and the drain region exhibits excellent electric characteristics in the reverse direction thereof. This allows the MOSFET to have sufficiently reduced leakage current and low on-state resistance, as compared with a conventional MOSFET having source and drain regions formed by the same process.

The leakage current and the on-state resistance with respect to the MOSFET of this example were measured. The leakage current at a drain voltage of 5 V (with a gate voltage of 0 V) was 2 $\mu$A. When applying a gate voltage, the on-state resistance was 800 $\Omega$.

For the purpose of comparison, the leakage current and on-state resistance of two conventional MOSFETs having source and drain regions formed by the same process were also measured. One of the MOSFETs was produced with the heat treatment carried out for 30 minutes for the formation of both the source and drain regions, while the other was produced with the heat treatment carried out for 5 hours. The conditions for the measurements of leakage current and on-state resistance were the same as those described above. The former MOSFET (i.e., one subjected to heat treatment for 30 minutes) had a leakage current of 50 μA and an on-state resistance of 800 Ω, while the latter MOSFET (i.e., one subjected to heat treatment for 5 hours) had a leakage current of 2 μA and an on-state resistance of 2 kΩ.

EXAMPLE 2

In this example, an inversion-mode n-channel MOSFET was produced using an SiC single crystal grown on an SiC single-crystal substrate. The MOSFET is of a vertical type in which source and drain layers are disposed one above the other in the direction of the thickness of an SiC single-crystal layer functioning as a channel formation layer. The source layer is formed by vacuum deposition of aluminum, and a Schottky junction is obtained between the channel formation layer and the source layer. The drain layer is formed by chemical vapor deposition, and a p-n junction is obtained between the channel formation layer and the drain layer.

Figure 3A:
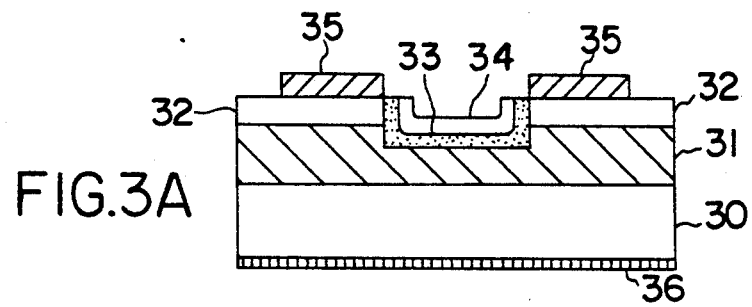
FIG. 3A is a sectional view showing another inversion-mode n-channel MOSFET of this invention.

FIG. 3A shows an MOSFET of this example, which was produced as follows.

Figure 3B:
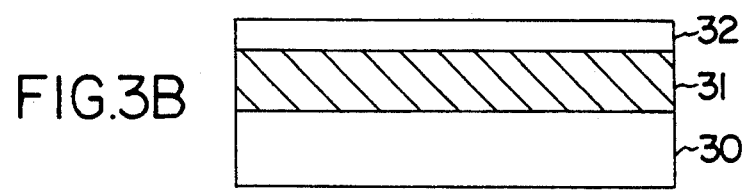
FIGS. 3B–3E are sectional views showing the production of the MOSFET of FIG. 3A.

First, as shown in FIG. 3B, on a 6H-type n-SiC single-crystal substrate 30 (with a resistivity of 0.05 Ω.cm), a 6H-type n-SiC single-crystal layer 31 (with a thickness of about 10 μm and a carrier concentration of $1 \times 10^{16}$ cm$^{-3}$) was grown as a drain layer by chemical vapor deposition. As the source gases, silane (SiH$_4$) and propane (C$_3$H$_8$) were used. Thereafter, trimethyl aluminum ((CH$_3$)$_3$Al) gas was added to the source gases to further conduct the chemical vapor deposition, thereby growing an Al-doped p-SiC single-crystal layer 32 (with a thickness of about 3 μm and a carrier concentration of $1 \times 10^{17}$ cm$^{-3}$) as a channel formation layer on the n-SiC single-crystal layer 31. A p-n junction was obtained between the p-SiC single-crystal layer 32 (i.e., channel formation layer) and the n-SiC single-crystal layer 31 (i.e., drain layer).

Figure 3C:
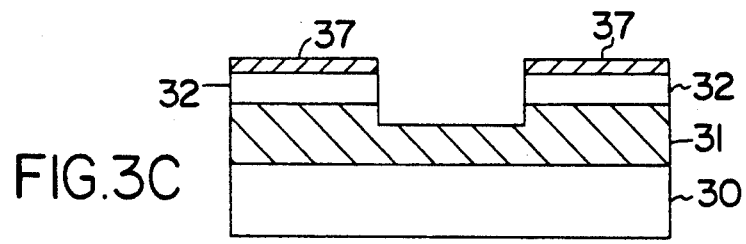

Then, the entire surface of the p-SiC single-crystal layer 32 was covered with an aluminum film 37 by vacuum deposition, followed by patterning with the use of photolithography. Using the patterned aluminum film 37 as a mask, a predetermined portion of the p-SiC single-crystal layer 32 and n-SiC single-crystal layer 31 was etched down to the depth of about 5 μm by a reactive etching technique, as shown in FIG. 3C. As the etching gases, tetrafluoromethane (CF$_4$) and oxygen (O$_2$) were used.

Figure 3D:
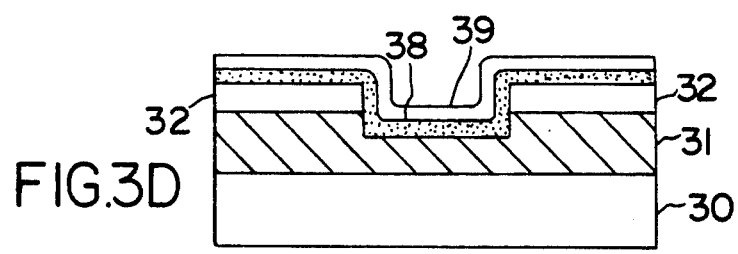

After the aluminum film 37 was removed, the thermal oxidation was conducted in an atmosphere of oxygen at about 1100° C. for 3 hours, resulting in a thermal oxide film 38 (with a thickness of about 500 nm). On the thermal oxide film 38, a P-doped Si polycrystalline film 39 (with a thickness of about 500 nm) was grown by chemical vapor deposition, as shown in FIG. 3D.

Figure 3E:
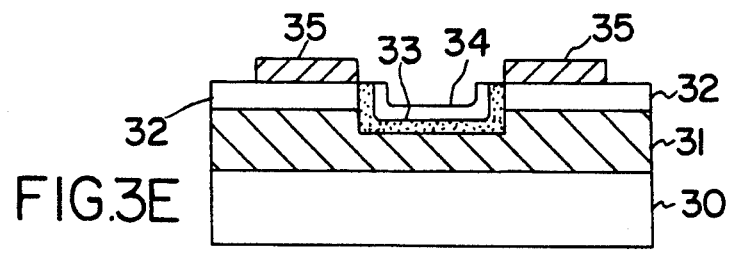

The thermal oxide film 38 and the P-doped Si polycrystalline film 39 were formed into a predetermined pattern, resulting in a gate insulating film 33 and a gate electrode 34, respectively. Thereafter, the exposed surface of the p-SiC single-crystal layer 32 was covered with an aluminum film by vacuum deposition, which was then formed in a prescribed pattern, resulting in an aluminum electrode 35, as shown in FIG. 3E. The aluminum electrode 35 would function as a source layer. A Schottky contact was obtained between the p-SiC single-crystal layer 32 (i.e., channel formation layer) and the aluminum electrode 35 (i.e., source layer).

Finally, an ohmic electrode 36 was formed from titanium on the back face of the n-SiC single-crystal substrate 30 by vacuum deposition, resulting in an n-channel inversion-mode MOSFET as shown in FIG. 3A.

In the MOSFET of this example, the p-n junction between the p-SiC single-crystal layer 32 (i.e., channel formation layer) and the n-SiC single-crystal layer 31 (i.e., drain layer) exhibited excellent electric characteristics in the reverse direction thereof; the reverse breakdown voltage was 500 V and the leakage current was 3 nA at a voltage of −50 V. However, in this p-n junction, the n value of its electric characteristics in the forward direction thereof was close to 2, the recombination current was predominant, and the series resistance was 20 Ω.

On the other hand, the Schottky contact between the p-SiC single-crystal layer 32 (i.e., channel formation layer) and the aluminum electrode 35 (i.e., source layer) exhibited poor electric characteristics in the reverse direction thereof, as compared with the above-mentioned p-n junction. In this Schottky contact, the reverse breakdown voltage was 300 V and the leakage current was 1 μA at a voltage of −50 V. The electric characteristics in the forward direction of this Schottky contact was excellent; the n value thereof was 1.05 and the series resistance was 0.5 Ω.

In the MOSFET of this example, as described above, the Schottky contact was provided between the p-SiC single-crystal layer and the source layer, while the p-n junction was provided between the p-SiC single crystal layer and the drain layer formed by chemical vapor deposition. Thus, the breakdown voltage between the source and drain layers was 500 V, the leakage current was 3 nA at a drain voltage of 50 V (with a gate voltage of 0 V), and the on-state resistance was 200 Ω when applying a gate voltage of 5 V. This indicates that the MOSFET of this example exhibited excellent device characteristics.

EXAMPLE 3

In this example, an inversion-mode n-channel MOSFET was produced using an SiC single crystal grown on an SiC single-crystal substrate. The MOSFET of this example is of a vertical type in which a source region and a drain layer are disposed one above the other in the direction of the thickness of an SiC single crystal layer functioning as a channel formation layer. The source region is formed by ion implantation to provide a p-n junction between the channel formation layer and the source region, while the drain layer is formed by chemical vapor deposition to provide a p-n junction between the channel formation layer and the drain layer.

Figure 4A:
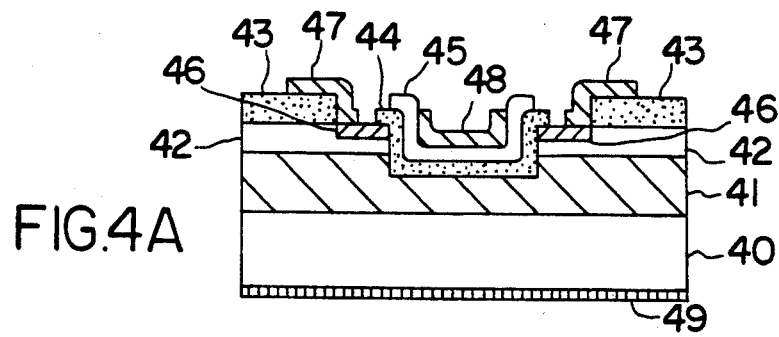
FIG. 4A is a sectional view showing still another inversion-mode n-channel MOSFET of this invention.

FIG. 4A shows an MOSFET of this example, which was produced as follows.

Figure 4B:
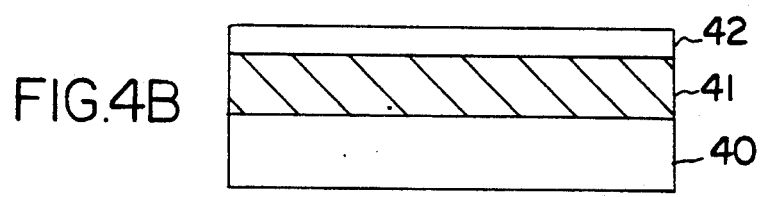
FIGS. 4B-4E are sectional views showing the production of the MOSFET of FIG. 4A.

First, as shown in FIG. 4B, on a 6H-type n-SiC single-crystal substrate 40 (with a resistivity of 0.05 Ω.cm), a 6H-type n-SiC single-crystal layer 41 (with a thickness of about 10 μm and a carrier concentration of $1 \times 10^{16}$ cm$^{-3}$) was grown as a drain layer by chemical vapor deposition. As the source gases, silane (SiH$_4$) and propane (C$_3$H$_8$) were used. Thereafter, trimethyl aluminum ((CH$_3$)$_3$Al) gas was added to the source gases to further conduct the chemical vapor deposition, thereby growing an Al-doped p-SiC single-crystal layer 42 (with a thickness of about 3 μm and a carrier concentration of $1 \times 10^{17}$ cm$^{-3}$) as a channel formation layer on the n-SiC single-crystal layer 41. A p-n junction was obtained between the p-SiC single crystal layer 42 (i.e., channel formation layer) and the n-SiC single-crystal layer 41 (i.e., drain layer).

Figure 4C:
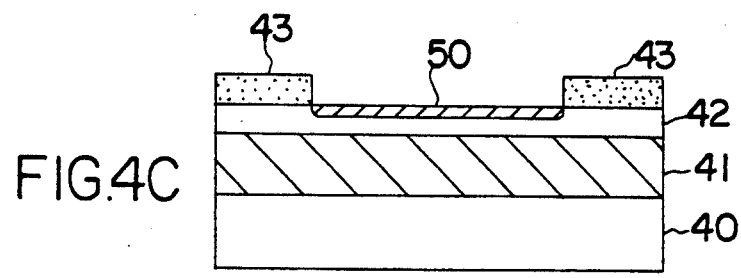

Then, an $SiO_2$ film was formed on the p-SiC single-crystal layer 42 by chemical vapor deposition. For the growth of the $SiO_2$ film, plasma chemical vapor deposition may also be used. Thereafter, a portion of the $SiO_2$ film corresponding to a device formation region was etched away using photolithography, resulting in a field insulating film 43 as shown in FIG. 4C. As the etchant, a solution of hydrogen fluoride (HF) was used.

Using the field insulating film 43 as a mask, nitrogen ions ($N^+$) were injected into the exposed surface portion of the p-SiC single-crystal layer 42, resulting in an ion-injected layer 50 as shown in FIG. 4C. The injection energy was 70 keV and the amount of injected ions was $5 \times 10^{15}$ cm$^{-2}$. Thereafter, heat treatment was conducted in an atmosphere of nitrogen at 1100° C. for 30 minutes, thereby activating the ion-injected layer 50.

Figure 4D:
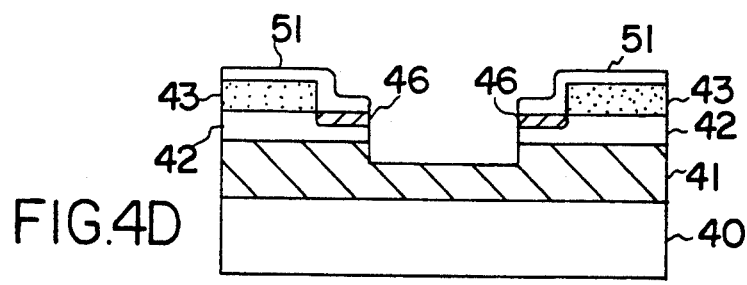

Then, the entire surface of both the field insulating film 43 and the ion-injected layer 50 was covered with an aluminum film 51 by vacuum deposition, followed by patterning with the use of photolithography. Using the patterned aluminum film 51 as a mask, a predetermined portion of the ion-injected layer 50, p-SiC single-crystal layer 42 and n-SiC single-crystal layer 41 were etched down to the depth of about 5 μm by a reactive etching technique, as shown in FIG. 4D. As the etching gases, tetrafluoromethane ($CF_4$) and oxygen ($O_2$) were used. The remaining portion of the ion-injected layer 50 became a source region 46. A p-n junction was obtained between the p-SiC single-crystal layer 42 (i.e., channel formation layer) and the source region 46.

Figure 4E:
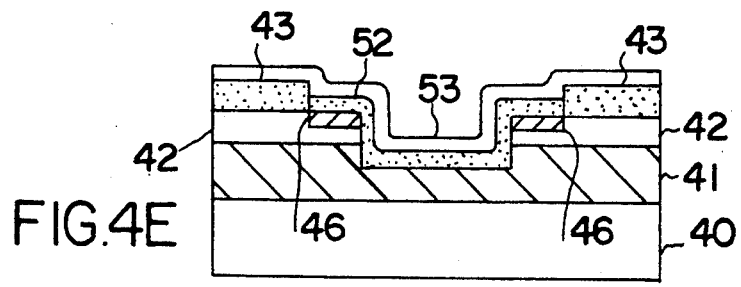

Thereafter, the aluminum film 51 was removed, and the thermal oxidation was conducted in an atmosphere of oxygen at about 1100° C. for 3 hours, resulting in a thermal oxide film 52 (with a thickness of about 500 nm). On the thermal oxide film 52, a P-doped Si polycrystalline film 53 (with a thickness of about 500 nm) was grown by chemical vapor deposition, as shown in FIG. 4E. The thermal oxide film 52 and the P-doped Si polycrystalline film 53 were formed in prescribed patterns, resulting in a gate insulating film 44 and a gate electrode 45, respectively, as shown in FIG. 4A.

The entire exposed surface of the field insulating film 43, gate insulating film 44, gate electrode 45 and the source region 46 was covered with a nickel film by vacuum deposition, which was then formed into a prescribed pattern. The back face of the n-SiC single-crystal substrate 40 was also covered with a nickel film by vacuum deposition. Thereafter, heat treatment was performed in an atmosphere of argon at 1050° C. for 5 minutes. As a result, ohmic electrodes 47 and 48 were obtained on the source region 46 and the gate electrode 45, respectively, while an ohmic electrode 49 was obtained on the back face of the n-SiC single-crystal substrate 40. In this way, an inversion-mode n-channel MOSFET such as shown in FIG. 4A was produced.

In the MOSFET of this example, as described above, the source region was produced by ion implantation to provide a p-n junction between the channel formation layer and the source region, while the drain layer was produced by chemical vapor deposition to provide a p-n junction between the channel formation layer and the drain layer. Thus, the breakdown voltage between the source region and the drain layer was 500 V, the leakage current was 3 nA at a drain voltage of 50 V (with a gate voltage of 0 V), and the on-state resistance was 300 Ω when applying a gate voltage of 5 V. This indicates that the MOSFET of this example exhibited excellent device characteristics.

It is understood that various other modifications will be apparent to and can readily be made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A silicon carbide field-effect transistor comprising a semiconductor substrate, a channel formation layer of silicon carbide formed above the substrate, source and drain regions provided in contact with the channel formation layer, a gate insulator disposed between the source and drain regions, and a gate electrode formed on the gate insulator, wherein a first contact between the channel formation layer and the drain region exhibits different electric characteristics from those of a second contact between the channel formation layer and the source region.

2. A silicon carbide field-effect transistor according to claim 1, wherein the source and drain regions are provided in the channel formation layer, and the gate insulator is formed on the channel formation layer.

3. A silicon carbide field-effect transistor according to claim 1, wherein the channel formation layer is formed on the drain region, and the source region is formed on the channel formation layer.

4. A silicon carbide field-effect transistor according to claim 1, wherein the channel formation layer is formed on the drain region, and the source region is provided in the channel formation layer.

5. A silicon carbide field-effect transistor according to claim 1, wherein the first contact is a p-n junction having excellent electric characteristics in the reverse direction thereof and the second contact is a p-n junction having excellent electric characteristics in the forward direction thereof.

6. A silicon carbide field-effect transistor according to claim 1, wherein the first contact is a p-n junction having excellent electric characteristics in the reverse direction thereof and the second contact is a Schottky junction having excellent electric characteristics in the forward direction thereof.

* * * * *